United States Patent [19]

Ise et al.

[11] 4,225,807
[45] Sep. 30, 1980

[54] READOUT SCHEME OF A MATRIX TYPE THIN-FILM EL DISPLAY PANEL

[75] Inventors: Masahiro Ise; Kenzo Inazaki; Katsuyuki Machino, all of Tenri; Chuji Suzuki, Nara, all of Japan

[73] Assignee: Sharp Kabushiki Kaisha, Osaka, Japan

[21] Appl. No.: 923,646

[22] Filed: Jul. 11, 1978

[30] Foreign Application Priority Data

Jul. 13, 1977 [JP] Japan .................................. 52-84352
Jul. 13, 1977 [JP] Japan .................................. 52-84353
Jul. 27, 1977 [JP] Japan .................................. 52-90660
Aug. 31, 1977 [JP] Japan ................................. 52-105179
Sep. 6, 1977 [JP] Japan ................................. 52-107423
Sep. 26, 1977 [JP] Japan ................................. 52-116205

[51] Int. Cl.$^2$ ......................................... H05B 33/08
[52] U.S. Cl. ................................ 315/169.3; 340/781
[58] Field of Search ......... 315/169 R, 169 TV, 169.3; 340/324 M, 166 EL, 760, 781; 313/494

[56] References Cited

U.S. PATENT DOCUMENTS 3,975,661   8/1976   Kanatani et al. ..................... 313/494

*Primary Examiner*—Eugene R. LaRoche
*Attorney, Agent, or Firm*—Birch, Stewart, Kolasch & Birch

[57] ABSTRACT

Between adjacent matrix type electrodes in a thin-film EL display panel, one of which is transparent, there is disposed an EL layer sandwiched by a pair of dielectric layers, which manifests a hysteresis curve when plotted with respect to the applied voltage vs light intensity characteristics. The thin-film EL display panel is further provided with at least one reference electrode. In reading out the memory state of the display panel, current is derived which has an amplitude equal to the difference between the current drawn through the reference electrode and the readout current.

5 Claims, 9 Drawing Figures

READOUT SCHEME OF A MATRIX TYPE THIN-FILM EL DISPLAY PANEL

BACKGROUND OF THE INVENTION

The present invention relates to a memory readout scheme for a three-layered thin-film EL display panel structure which manifests hysteresis memory effects when pletted with respect to applied voltage and light emission intensity, and more particularly to a readout scheme of a thin-film EL display panel having a matrix electrode pattern with an improved signal to noise (SN) ratio.

As disclosed and illustrated in U.S. Pat. No. 3,975,661 DRIVING METHOD FOR A THIN-FILM ELECTROLUMINESCENT ELEMENT OF A THREE-LAYER CONSTRUCTION assigned to the same assignee as this application, a thin-film EL display has a three-layered structure shown in a perspective view partly in cross section of FIG. 1, the disclosure of which is incorporated herein. A predetermined number of transparent electrode strips 2 are disposed on a glass support 1. Further, a layer 3 of dielectric material such as $Y_2O_3$, $Si_3N_4$, $TiO_2$ and $Al_2O_3$, a layer 4 of electroluminescent material, for example, ZnS doped with Mn (yellowish orange light) and a second layer 31 of dielectric material such as $Y_2O_3$, $Si_3N_4$, $TiO_2$, $Al_2O_3$ are disposed by a well known thin-film technique such as vacuum deposition and sputtering each having a thickness ranging from 500 to 10,000 Å. This results in a double-isolation three-layered structure of the EL display panel. A different family of strip electrodes 5 is disposed in a direction normal to the direction of the transparent electrodes 2 to form an electrode matrix array together with the transparent electrodes. With such a three-layered thin-film EL display panel, if one of the first family 2 of the electrodes and one of the second family 5 of the electrodes are selected, a minute area, where the selected ones of the first and second family of electrodes cross each other, will emit light. This corresponds to a picture element of an image like a character, a symbol and a pattern being displayed.

The EL panel with a structure is more attractive than the prior art dispersed powder type EL panel from the standpoint of light intensity, working life and performance stability. The above described EL panel is more advantageous than the prior art in that it exhibits a hysteresis curve when plotted with respect to applied voltage and light emission intensity, as seen from FIG. 2(b). When first applying a pulse of the voltage amplitude $V_1$ as shown in FIG. 2(a), the intensity of the EL panel is at the value $B_1$ as shown in FIGS. 2(b) and 2(c). The sustained voltage $V_1$ is correlated as $V_1 > V_{th}$ wherein $V_{th}$ is the threshold voltage level for light emission. Consecutive application of the sustained voltage $V_1$ permits the intensity $B_1$ to be held. If a write voltage $V_2$ is then applied, the brightness will than go up to $B_3$. Even if the sustained voltage $V_1$ is reached again in a brief period, the intensity will settle at a value $B_2$ higher than the previous one $B_1$. Consecutive application of the sustained voltage $V_1$ keeps the brightness $B_2$ constant. When an erase voltage $V_3$ is applied, this causes the intensity to drop. If the sustain voltage is reapplied, then the intensity will settle at $B_1$. This time relationship is illustrated by using the same time references $t_1, t_2 \ldots t_{21}$ as in FIGS. 2(a) to 2(c). The hysteresis phenomenon may trace a different loop according to a selection of the amplitude, pulse width and frequency of the write voltage. In other words, a half tone display is also possible. Once the write voltage or the erase voltage has been applied in this way, the individual picture elements keep emitting light without losing their own tones, in response to the application of the sustain pulse. Though the respective levels of voltage depend mainly on compositions, thicknesses, manufacturing conditions and waveforms of applied voltages, the inventors' experiments revealed that $V_{th} = 200$ V, $V_1 = 210$ V, $V_2 = 210$ to 280 V and $V_3 = 190$ V, for example.

As noted earlier, the three-layered thin-film EL display panel is capable of reading out, electrically, the memory state thereof in addition to the functions of writing, erasing and sustaining by a proper selection of applied voltage, pulse width and pulse frequency.

The thin-film EL panel can be considered a capacitive element because of the fact that the electroluminescent layer sandwiched by the pair of dielectric layers, so that displacement current may flow through the EL panel when applying the sustain voltage. If the display element is latched in the light emitting state or write state, the displacement current will flow in response to the application of the sustain voltage plus current which is proportional to the brightness. This combined current is called polarization current. Actually because the background is held at some potential even in the erase state, a small amount of the displacement current will flow correspondingly. For example, while the EL element is supplied with the sustained voltage pulse as seen from FIG. 3(a), current flowing through the EL element will assume the waveform shown by the solid line I in FIG. 3(b) in the erase state and the waveform which is combined with the polarization current as depicted by the dotted line II in the write state.

The inventors' approach to determine the presence or absence of the polarization current involves a decision as to whether the displacement current exceeds a given amount taking a noise margin into account, thereby determining whether the EL element is in the write state or in the erase state. However, since this method is used to separate the displacement current from the polarization current at a predetermined level, a selection of the predetermined level needs careful consideration. The component of the polarization current over the predetermined level is equal to that minus the noise margin and the absolute value of this signal is extremely small. A signal-to-noise ratio is therefore not good.

It seems possible to remove undesirable current in the erase state by provision of an equivalent circuit consisting of analog elements such as capacitors and resistors which forms current similar to the displacement current or provision of a read only memory which stores the very waveform of that undersirable current in the erase state. Although these approaches are basically applicable to an EL unit element, the following problems will occur with respect to an EL matrix type element.

(1) In the case of matrix driving, the amplitude of the displacement current will vary greatly according to the number of the picture elements to be written and that to be erased. To this end it is rather difficult to form the equivalent circuit or the erase waveform.

(2) In order to efficiently cause light emission from the thin-film EL element, at least electrodes at the display side should be transparent. The transparent electrodes should be disposed at a much narrower interval in order to withstand a higher resistance as in the case where the display density is increased in a matrix display. This leads to a substantial difference in resistance between the display electrode closest to the lead region and that farthest from the same and therefore a substantial variation in the effective applied voltage results. Therefore, even though the same pulse is externally applied, the waveform of current will vary from point to point in the read out mode. This requires a predetermined number of equivalent circuits for storing the respective erase state current waveforms and thus renders a readout scheme complicated and large sized and expensive.

It is therefore an object of the present invention to provide an improved readout scheme for use in a matrix type EL display panel which overcomes the above described problems recognized by the inventors.

A matrix type thin-film EL display device embodying the present invention is provided at a portion of the display electrodes thereof in addition to a reference electrode. Current flowing through the reference electrode is utilized such that the erase state current or dark current cancels the displacement current. This makes it possible to pick up only the polarization current which is indicative of the internal state of the EL display device.

BRIEF DESCRIPTION OF THE DRAWINGS

Other objects and many of the attendant advantages of the present invention will be easily appreciated as the same becomes better understood by reference to the following detailed description which should be considered in conjunction with the accompanying drawings in which like reference numerals designate like parts throughout the figures thereof, and wherein.

DETAILED DESCRIPTION OF THE INVENTION

Figure 4:
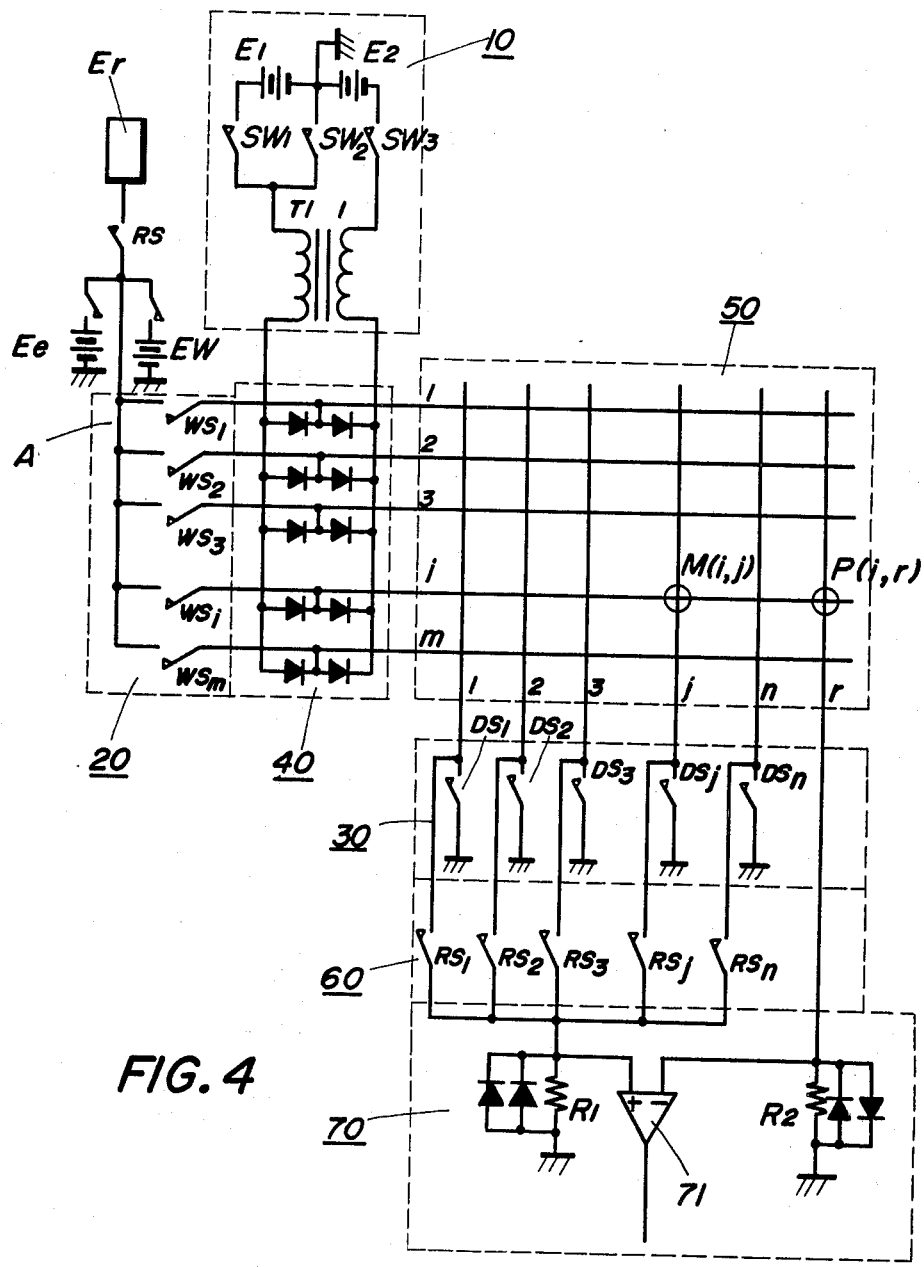
FIG. 4 is a circuit diagram of one preferred form of the present invention.

Referring now to FIG. 4, there is illustrated one preferred form of the present invention which can be generally divided into six blocks.

The first block is a sustain driver circuit 10. Through FIG. 4 shows a three-phase sustain driver circuit, one which is clocked with four-phase timing signals can be used. Two sustain voltage sources $E_1$ and $-E_2$ are prepared and an EL display panel 50 is supplied with three voltages, namely, $E_1$, 0 and $-E_2$, respectively and applied concurrently with the sequential operation of three switches $SW_1$, $SW_2$ and $SW_3$. A transformer T is connected in series with the capacitive component of the EL display device 50 to form a resonant circuit and to enable a highly efficient voltage supply.

The second block is a write and read switch circuit 20 which supplies a write voltage $V_w$ from a voltage source $E_w$ via a switch $W_{sk}$ (k=1 to m) to a line X sought to be written in when in the write mode. If the line X is desired to be read out with respect to the internal state, the line X is supplied with a readout voltage $V_r$ from a readout driver circuit 70 which is adapted to supply a voltage equal to the sustain voltage $V_s$.

The third block is a set of switches 30 disposed at the transparent electrodes of the EL display device. All of the switches 30 are shunted during the sustain mode or phase and selected ones of the Y lines are turned on with the remaining Y lines kept off during the write, erase and readout modes.

The fourth block is a write and read separation and sustain voltage amplitude holding circuit 40, and to more particularly a diode circuit adapted to separate write lines from non-write lines and hold the amplitude of resonance driving.

Figure 1:
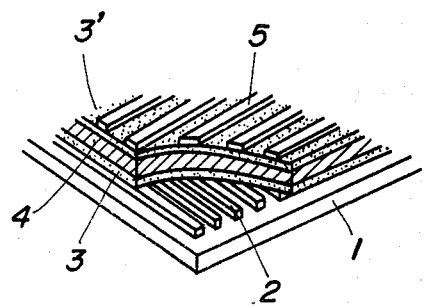
FIG. 1 is a perspective view partly in cross section of a threelayered structure thin-film EL display panel.
Figure 2:
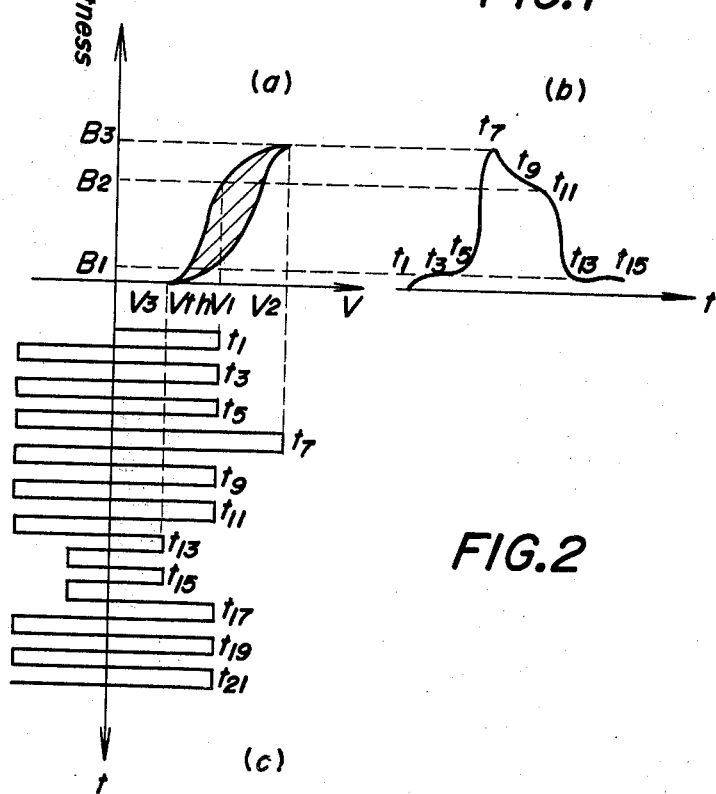
FIG. 2 is a graph showing the relationship between applied voltage and light emission intensity illustrating the operation of the display panel of FIG. 1.
Figure 3:
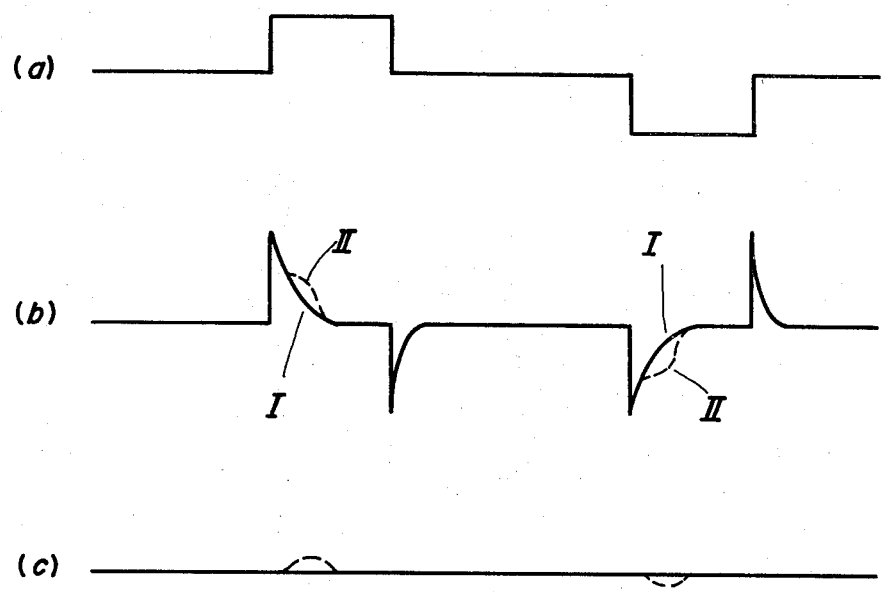
FIG. 3 is a waveform diagram of the current in the readout mode of the display panel.

The fifth block 50 is the three-layered structure EL display device of the matrix type as illustrated in FIG. 1 wherein the extreme left electrode from the transparent strip electrodes, is used as the reference electrode r for the purpose of the present invention. Only the electrodes are shown in FIG. 4.

The sixth block is a readout circuit which plays an important role in the present invention. An in-phase signal cancelling amplifier 61 cancels the voltage developed across a resistor $R_1$, which is connected in common to the respective electrodes 1 to n, and a counterpart is developed across a resistor $R_2$, connected to the reference electrode r, with respect to each other and therefore picks up only the polarization current.

Specification of an 8 inch EL panel devised by the inventors is as follows:

| | |
|---|---|
| line pitch: | two lines / mm |
| | X lines (transparent electrodes) 320 |
| | Y lines (Al electrodes) 240 |
| display character: | 5 by 7 dot pattern |
| | 64 sorts of Roman letters, Arabic letters and symbols |
| the number of display characters: | X direction 52 characters |
| | Y direction 24 lines |
| | maximum number 1248 characters |
| the number of effective display lines: | X direction 260 lines |
| | (character interval 1 line) |
| | Y direction 168 lines |
| | (line interval 2 lines) |

Returning to FIG. 4, the first sustain switch $SW_1$ is closed at a first timing $\phi_1$ so that a difference between a third hold potential $V_H$ and the first source voltage $E_1$ is applied across the capacitive element (in the given example the entire EL display panel is considered approximately as a capacitor element $C_t$ of a predetermined capacitance). A first hold potential can be represented below.

$$V_{sl} = E_1 + \eta(B_1 - V_H) \quad (1)$$

If the second sustain switch $SW_2$ is closed at a second timing $\phi_2$, then a second hold potential will assume:

$$-V_{s2} = -E_2 - \eta(V_1 + E_2) \quad (2)$$

Subsequently, if the third sustain switch SW₃ is closed at the third timing $\phi_3$, then a third hold potential will assume:

$$V_H = V_2 \qquad (3)$$

The three-phase sustain drive is carried out in this manner. This three-phase sustain drive can reduce the breakdown voltage requirement for switches $D_{sl}$—$D_{sn}$ by performing the write mode with the intermediate potential (in the given example the third hold potential $V_H$).

During application of the intermediate potential ($V_H$), and X and Y lines of a picture point M(i, j) to be written are selected by the write/read switch circuit 20 and the switch 30 for the purpose of supplying the write voltage $V_w$ and carrying on the write mode. The erase mode is carried out similarly with the exception that a picture point is supplied with an erase voltage $V_e$ (not shown).

The readout mode of the present invention is carried out in the following manner. By closure of an X switch $DS_j$ and a Y switch $WS_i$ associated with a picture element M(i, j) to be read out, that picture element is supplied with the sustain pulse voltage $V_s$. At this time, pulse current will flow through the resistor R₁ and reaching the +terminal of the amplifier 61. Reference current, flowing through a reference point P(j, r) of the reference electrode r, will be developed across the resistor R₂. Since the reference line r is not written, the erase state current and, thus, only the displacement current, is derived therefrom. This is supplied to the −terminal of the amplifier 61. Accordingly, with the amplifier 61, only the displacement current, though the picture point being read out, is cancelled by current developed across the resistor R₂. A differential voltage is derived so that only the polarization current is picked up when the picture element being read out is in the write state. The current will be insignificant (namely, zero) as long as all the picture elements being read out are in the erase state.

As described above, since the present invention employs, (as the reference electrode only one transparent electrode) within the EL display device, the output from that reference electrode results in a displacement current which is equal to the displacement current flowing in fact through the picture elements being read out despite influences of the electrode resistance and the number of the picture elements present in the write state. In addition, the horizontal scanning electrodes, and not the picture elements M being read out, are grounded and fixed at zero potential to thereby facilitate the performance of the readout mode without the need to use troubling crosstalk capacitors. Thus, the present invention makes it possible to obtain signals with a signal to noise ratio of an approximately ideal value.

Though only one reference electrode is provided in the embodiment of FIG. 4, two reference electrodes may be provided instead as in the case where contact areas of the horizontal scanning electrodes are disposed alternatively at the upper portion or at the lower portion so as to increase the electrode density. It is further desirable to avoid wrong operations which may be caused by variations in the amplitude of the displacement current due to variations in the number of the picture elements in the write state along the horizontal scanning electrodes.

Figure 5:
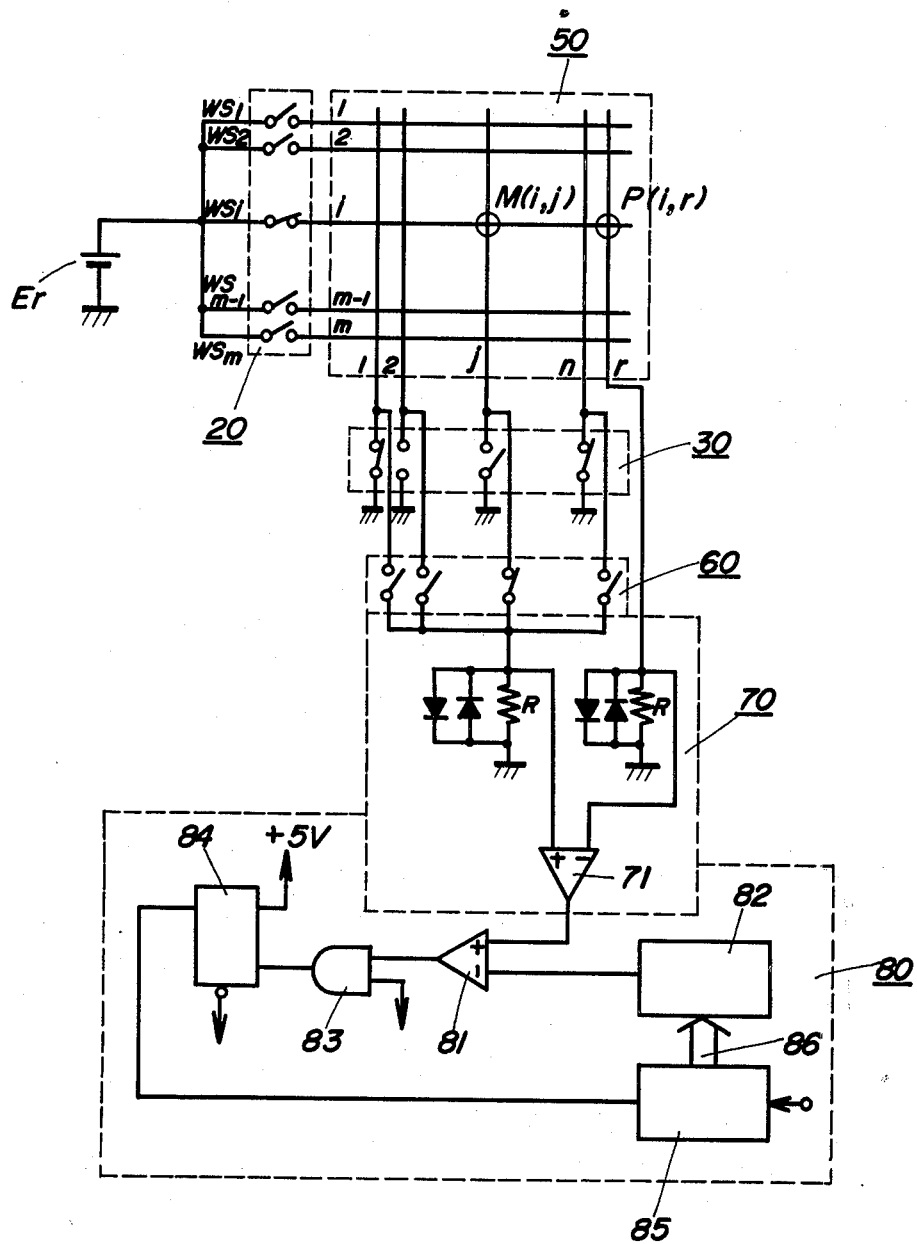
FIG. 5 is a circuit diagram of another preferred form of the present invention.

FIG. 5 is another embodiment of the present invention provided for taking the above problem into account, which is adapted to read out data, with the blocks 10 and 40 omitted. This circuit is used to compensate for variations in the level of the displacement current through the utilization of a vertical scanning electrode m.

The readout output is applied to a level compensation and readout signal decision circuit 80. An analog comparator 81 receives at the + terminal thereof the output of an amplifier 71 and the − terminal thereof the output of a digital to analog converter 82. The output of the analog comparator 81 is supplied to an AND gate 83 which also receives the readout pulse. The output of the AND gate 83 is applied to an input terminal c of a flip-flop 84 which holds the data which has been read out. The output of the vertical scanning electrode m is sent to a controlling microprocessor 85 which in turn loads data into the digital to analog converter 82 via a data line 86.

Figure 6:
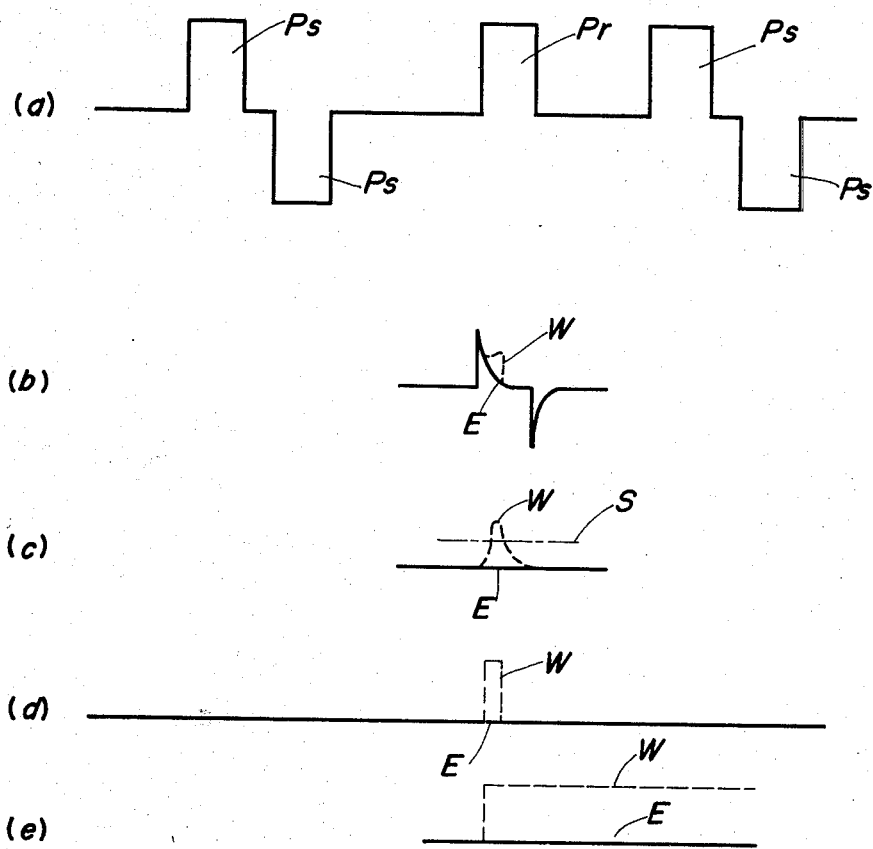
FIG. 6 is a time chart for illustration of operation of the circuit of FIG. 5.

A time chart associated with the circuit 80 is depicted in FIG. 6. While the sustain pulse $P_s$ is applied as seen from FIG. 6(a), selected picture element current is obtainable through a selected picture element upon application of the readout pulse $P_r$. In FIG. 6(b), the waveform E depicted by the solid line is the erase state current and the waveform W depicted by the dotted line is the write state current.

Within the analog comparator 81, the selected picture element current is compared with the analog output S of the digital to analog converter (see FIG. 6(c)). As a result, the logic output "1" or "0" is outputted in accordance with the results of the comparison. The logic output is available from the AND gate 83. The flip flop 84 is inverted in response to the output of the AND gate 83 to sustain the readout output. Since the flip flop is adapted to receive a clear pulse at the terminal $C_r$ thereof immediately before the readout mode, the flip flop is set in accordance with the level of the readout current.

Figure 7:
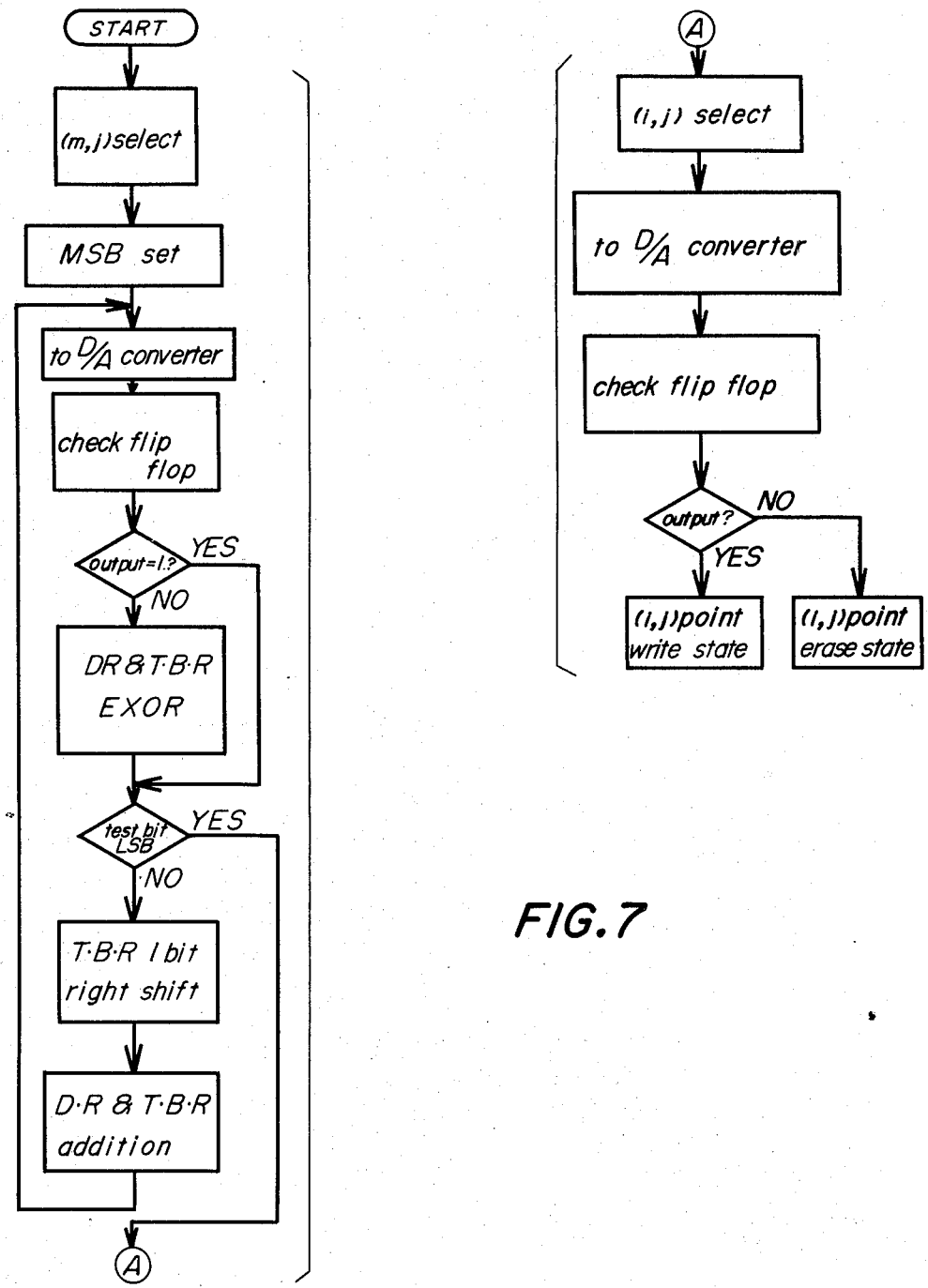
FIG. 7 is a flow chart for illustration of operation of the circuit of FIG. 5.

The events in sequence in reading out the state of the point M(i, j) are described with reference to a flow chart of FIG. 7.

First of all, the first step is executed to select the vertical scanning electrode m and the horizontal scanning electrode j and to start evaluating an erase level of the reference picture element (m, j) utilizing the analog to digital conversion. In the succeeding or second step, a data register and a test bit register is loaded with only MSB. The third step is carried out where the contents of the data register are sent to the digital to analog converter 82. In the fourth step, the thin-film EL panel is supplied with the readout pulse and then the contents of the flip flop 84 are checked up. The fifth step is executed to decide whether the output of the flip flop 84 is "1" and, if a NO answer is given, the sixth step is executed to perform an exclusive OR logic operation on the data register and the test bit register so as to clear that bit. In the case of a YES answer the seventh step is carried out to decide whether the test bit is LSB. If a NO answer is concluded during the seventh step, the eighth step is executed to shift the contents of the test bit register one bit to the right. In the presence of a YES answer, the tenth and following steps are reached to detect the contents of the selected picture elements. In the ninth step, the contents of the data register is added to the contents of the test bit register, the results of the addition being loaded again to the data register. Subsequent to this, the third step is restarted.

During the tenth step the vertical scanning electrode i and the horizontal scanning electrode j are selected. The erase level data of the reference picture element obtained during the eleventh step is provided for the digital to analog converter 82 together with an appropriate margin. In the twelfth step, the readout pulse is supplied to investigate the flip flop 84. In the thirteenth step, it is decided whether the output is "1" and, when a YES answer is given, it is concluded, during the fourteenth step, that (i, j) is now in the write state. In the case of a NO answer, the fifteenth step confirms that (i, j) is now in the erase state.

When it is desired to read out the contents of the picture elements in sequence, it will be unnecessary to carry on the time consuming analog to digital conversion in advance by evaluating the erase levels of the picture elements (m, o) to (m, n−1) plus an appropriate margin.

When implementing the switches in the block 30 include transistors, it is desirable that the number of necessary transistors per electrode be as small as possible. While carrying on the write mode and erase mode on one or more selected picture elements, the horizontal scanning electrodes which include the selected picture elements (these are called selected line electrodes hereinafter) should be grounded and the horizontal scanning electrodes which do not include the selected picture elements (these are called non-selected line electrodes hereinafter) should be kept off. During the readout mode, all the non-selected line electrodes, except for the selected line electrodes, should be grounded with the latter kept off.

Figure 8:
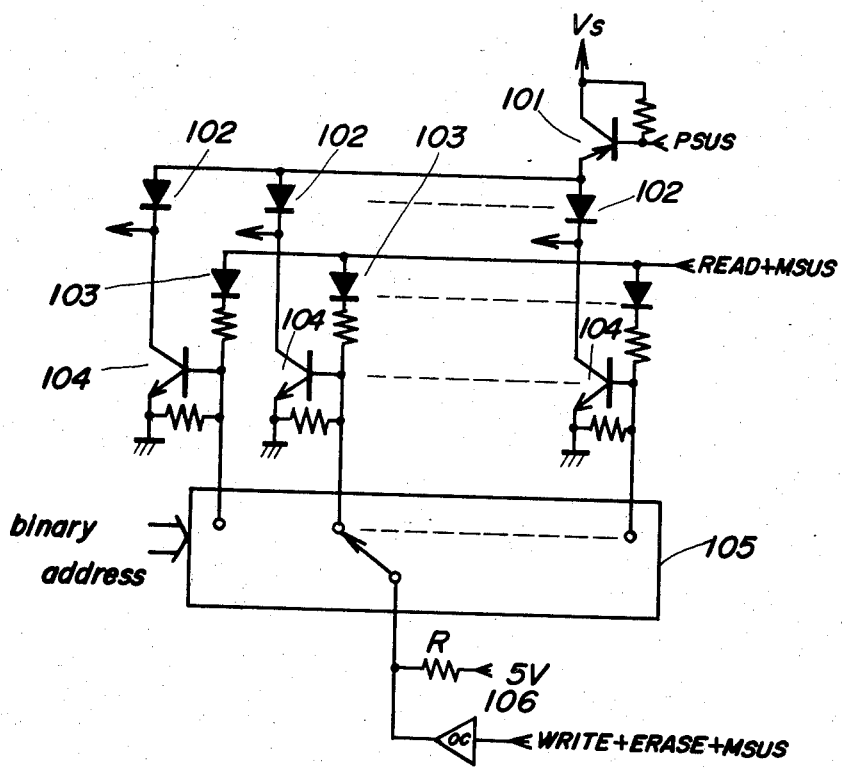
FIG. 8 is a circuit diagram of still another modification of the present invention.

A circuit having such functions is illustrated in FIG. 8, and includes: a plus side sustain pulse which supplies a high voltage, high power transistor 101 which is supplied with a plus side sustain pulse signal PSUS; electrode separating diodes 102 operable during the application of the plus side sustain pulse; the write mode, erase mode and readout mode; second diodes 103 which turn on all the high voltage transistors (except transistors connected to the selected line electrodes during the readout mode) in response to the readout pulse; READ and a minus side sustain pulse MSUS which isolates them from each other during the selective write mode and the erase mode; transistors 104 which ground the selected line electrodes during the selective write mode and the erase mode; all the non-selected line electrodes during the readout mode and all the line electrodes during the application of the minus side sustain pulse, and an analog switch 105 which is responsive to a binary address to turn on the transistors 104 connected to the selected line electrodes during the selective write mode and erase mode, and to turn off the same connected to the selected line electrodes during the readout mode; and an open-collector TTL buffer 106 which is responsive to a write pulse WRITE, an erase pulse ERASE and the minus side sustain pulse MSUS. The buffer 106 is of the opencollector type where the base current is adjustable through a resistor R.

Figure 9:
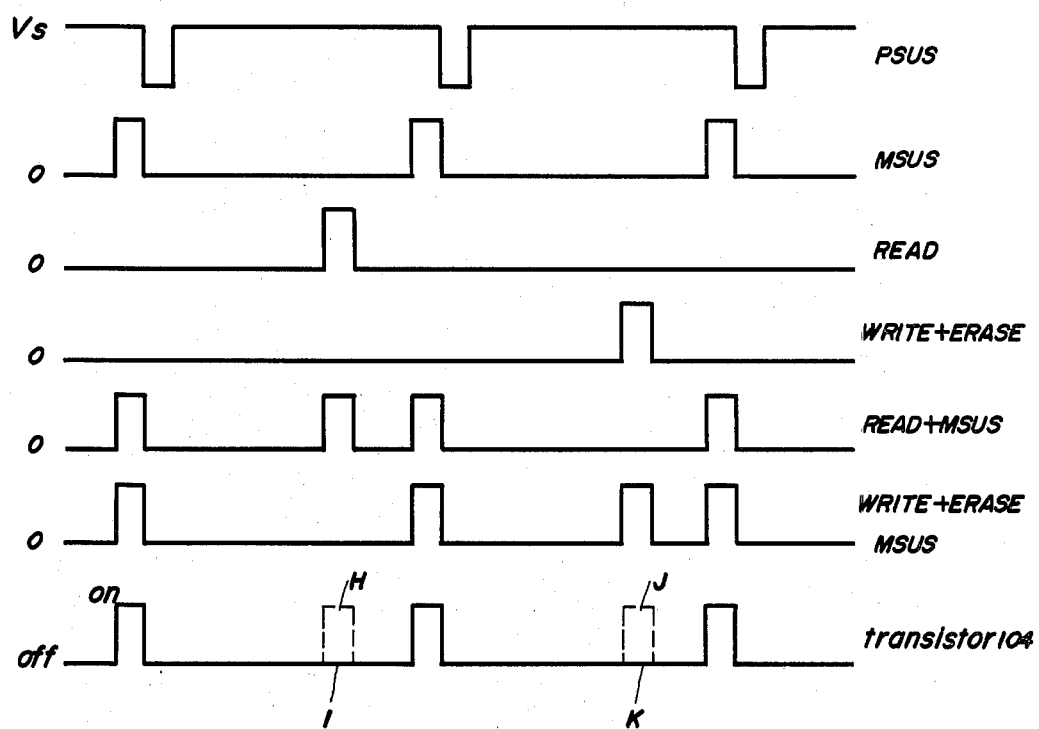
FIG. 9 is a time chart associated with the circuit of FIG. 8.

In the above illustrated embodiment, the transistors 101 and 104 of FIG. 8 are also provided for the vertical scanning electrodes in order to achieve the sustain driving using the single source voltage $+U_s$ (two voltage sources $+E_1$ and $-E_2$ are used in FIGS. 4 and 5). When the transistor 101 at the horizontal scanning electrodes is turned on to enable the supply of the sustain voltage $+V_s$ during the sustain driving, that transistor grounds all the vertical scanning electrodes. When the sustain voltage $+V_s$ is supplied from the vertical scanning electrodes, the transistors 104 are turned on to render all the horizontal scanning electrodes grounded. The sustain driving in the given example is called the seesaw method. Operation of this circuit is described by referring to a time chart of FIG. 9. In FIG. 9, PSUS designates a signal to be applied to the plus side sustain pulse supplying transistor 101 and MSUS designates a signal to be applied to the minus side sustain pulse supplying transistors 104. Though FIG. 9 shows the time relationship at the horizontal scanning electrodes, the time relationship between the signals PSUS and MSUS is reversed at the vertical scanning electrodes.

The readout pulse signal READ is applied to the transistors 104 during the readout mode. At this time the analog switch 105 selects the readout electrodes in response to the binary address signal. Since there is no input to the open-collector type buffer 106, it provides no output so that the base of the selective readout transistor 104 is held at the zero potential. That transistor 104, is turned off and the remaining transistors 104 are turned on. The waveform H in FIG. 9 indicates that the transistor 104 connected to the non-selected line electrodes, are in the on state during the readout mode; and the solid line I indicates that the transistors 104, connected to the selected line electrodes, are in the off state. The time relationship between the minus sustain pulse signal MSUS and the readout pulse signal READ is designated by READ+MSUS in FIG. 9. The write pulse signal or erase pulse signal WRITE+ERASE is applied to the open-collector buffer 106. Simultaneously the analog multiplexer 105 selects the electrodes to be written or erased. The output of the open-collector TTL buffer, therefore, assumes "1" so that the base current is supplied from the voltage source +5 V to the selected line electrodes via the resistor R and the multiplexer 105. It is possible to supply current in the opposite directions during the readout mode, the write or the erase mode because of the bidirectional nature of the multiplexer 105. To this end only the transistors 104, connected to the selected horizontal scanning electrodes, are turned on with the remaining transistors off. The dotted line J in FIG. 9 indicates that the transistors 104, connected to the selected line electrodes, are in the on state during the write mode and the erase mode, whereas the solid line K indicates that the transistors 104 connected to the non-selected line electrodes are in the off state during the write mode or the erase mode. WRITE+ERASE+MSUS in FIG. 9 shows the time relationship between the write pulse signal WRITE, the erase pulse signal ERASE, and the minus sustain pulse signal MSUS which is applied to the open-collector type buffer 106.

In the circuit of FIG. 8, the collectors of the transistors 104 are connected to the switches 60 in order to supply the readout current (from the transistors 104, associated with the selected line electrodes) to the switches 60 of FIGS. 4 and 5.

It is obvious to those skilled in the art that a differential transformer is also applicable for detecting the polarization current instead of the differential amplifier as disclosed with respect to the above embodiments. It is further apparent that the reference electrode may be disposed around the middle of the display panel.

The invention being thus described, it will be obvious that the same may be varied in many ways. Such modifications are not to be regarded as a departure from the spirit and scope of the invention, and all such modifications are intended to be included within the scope of the following claims.

What is claimed is:

1. A display device having a plurality of picture elements comprising:
    a thin-film EL display panel comprising an EL layer sandwiched by a pair of dielectric layers said EL display panel manifesting a hysteresis curve in the applied voltage vs brightness characteristics, and a matrix electrode array sandwiching said pair of dielectric layers for matrix driving said EL display panel;
    reference electrode means disposed on said thin-film EL display panel; and
    means for deriving current having an amplitude equal to a difference between the current through said reference electrode and a readout current when reading out the memory state of said display panel.

2. The display device as defined in claim 1 wherein said reference electrode means comprises two reference electrodes extending in opposite directions from each other.

3. The display device as defined claim 1 further comprising circuit means for connecting all of said picture elements not desired to be read out to a ground potential.

4. The display device as set forth in claim 1 wherein selected ones of said picture elements of said thin-film EL display panel desired to be read out are selected by transistors, said transistors being controlled by an analog multiplexer.

5. A display device comprising:
    a thin-film EL display panel comprising an EL layer sandwiched by a pair of dielectric layers which manifests a hysteresis curve in the applied voltage vs brightness characteristics, and matrix electrode array means sandwiching said pair of dielectric layers for matrix driving said EL display panel;
    a plurality of transistors respectively connected between said matrix electrode array means of said EL display panel and a ground potential;
    first circuit means for supplying all of said transistors with a readout signal and for turning on said transistors;
    an analog multiplexer means for selecting said transistors; and
    second circuit means for turning off said transistors via said analog multiplexer during the readout mode and for turning on said transistors during the write and erase modes.

* * * * *